US005989785A

United States Patent [19]

Ishihara et al.

[11] Patent Number: 5,989,785

[45] Date of Patent: Nov. 23, 1999

[54] PROCESS FOR FABRICATING AN ELECTROLUMINESCENT DEVICE

[75] Inventors: Hajime Ishihara, Nagoya; Kazuhiro Inoguchi, Toyota; Nobuei Ito, Chiryu; Tadashi Hattori, Okazaki, all of Japan

[73] Assignee: Nippondenso Co., Ltd., Kariya, Japan

[21] Appl. No.: 08/941,753

[22] Filed: Sep. 30, 1997

Related U.S. Application Data

[63] Continuation of application No. 08/577,349, Dec. 22, 1995, abandoned.

[30] Foreign Application Priority Data

| | | | |
|---|---|---|---|
| Dec. 22, 1994 | [JP] | Japan | 6-336533 |
| Sep. 12, 1995 | [JP] | Japan | 7-260894 |

[51] Int. Cl.[6] .............................. G03F 7/00; H05B 33/10

[52] U.S. Cl. .............................. 430/317; 430/313; 430/319; 430/321

[58] Field of Search .............................. 430/313, 319, 430/321, 316, 317

[56] References Cited

U.S. PATENT DOCUMENTS

| | | | |
|---|---|---|---|
| 4,728,519 | 3/1988 | Tanimoto | 427/66 |
| 4,924,144 | 5/1990 | Menn et al. | 313/506 |
| 5,164,799 | 11/1992 | Uno | 313/509 |
| 5,346,776 | 9/1994 | Taniguchi et al. | 313/506 |
| 5,539,424 | 7/1996 | Hattori et al. | 313/509 |

FOREIGN PATENT DOCUMENTS

| | | | |
|---|---|---|---|
| 1-019759 | 4/1989 | Japan | H05B 33/22 |
| 1-276592 | 11/1989 | Japan . | |
| 2-126591 | 5/1990 | Japan | H05B 33/14 |
| 2-304894 | 12/1990 | Japan . | |
| 2-306580 | 12/1990 | Japan . | |
| 4-039894 | 2/1992 | Japan | H05B 33/14 |
| 4-218293 | 8/1992 | Japan | H05B 33/14 |
| 4-229988 | 8/1992 | Japan | H05B 33/10 |
| 4-351885 | 12/1992 | Japan | H05B 33/10 |
| 5-011392 | 2/1993 | Japan | H05B 33/22 |

*Primary Examiner*—John A. McPherson
*Attorney, Agent, or Firm*—Pillsbury Madison & Sutro LLP

[57] ABSTRACT

In an electroluminescent device comprising an insulating substrate having consecutively thereon a first electrode, a first insulating layer, a luminescent layer composed of two types or more luminescent portions differing in luminescent color which are provided in a flat panel arrangement to give a single-layered luminescent layer, a second insulating layer and a second electrode, a first dielectric film is disposed between the luminescent portions to provide an isolation layer for isolating the luminescent portions, and a second dielectric film for adjusting the luminescence threshold voltage is disposed on the light outcoupling side or on the side opposite thereto of one of said luminescent portions. Herein, the first and second dielectric films provided for isolating the luminescent portions and for adjusting the luminescence threshold voltage, respectively, are made of the same material and have a refractive index lower than that of both luminescent portions.

46 Claims, 8 Drawing Sheets

PROCESS FOR FABRICATING AN ELECTROLUMINESCENT DEVICE

This is a continuation of application Ser. No. 08/577,349, filed on Dec. 22, 1995, now abandoned.

CROSS REFERENCE TO RELATED APPLICATION

This application is based upon and claims the benefit of priority of the prior Japanese Patent applications No. 6-336533 filed on Dec. 22, 1994 and No. 7-260894 filed on Sep. 12, 1995, the contents of which are incorporated herein by reference.

BACKGROUND OF THE INVENTION

1. Field of the Invention

The present invention relates to a multicolor electroluminescent device of a flat-panel display type, and to a process for fabricating the same.

2. Related Arts

Multicolor light-emitting device structures using electroluminescent devices known heretofore include those comprising a plurality of luminescent regions differing from each other in luminescent color, the luminescent regions being arranged in a same plane and interposed between insulating layers.

In the electroluminescent devices of this type, the luminescent regions differing in color also differ from each other in luminescence threshold voltage (a voltage for triggering light emission). Accordingly, means for realizing a uniform luminescence threshold voltage for the luminescent regions have been heretofore proposed in, for instance, unexamined Japanese Utility Model publication Hei-5-11392. The structure disclosed therein comprises a first luminescent portion containing a manganese-doped zinc sulfide (ZnS:Mn) and a second luminescent portion containing zinc sulfide doped with a rare earth element (ZnS:RE, where RE represents a rare earth element) arranged in a same plane in such a manner that the first and the second luminescent portions are in contact with each other to form a dichromatic luminescent layer. The publication further discloses that the structure constructed as above should include a dielectric layer interposed between the first luminescent portion and an insulating layer which envelops the luminescent layer. Though the luminescence threshold voltage of the first luminescent portion is lower than that of the second luminescent portion, the interposed dielectric layer lowers the voltage applied to the first luminescent portion for a voltage corresponding to that applied to the dielectric layer, and thus, the same drive voltage can be applied to the first and second luminescent portions.

Furthermore, in the electroluminescent devices above, it is necessary to prevent crosstalk of light from occurring between the luminescent regions. For instance, a structure disclosed in unexamined Japanese Patent publication Hei-4-39894 comprises light-absorbing materials interposed between the luminescent regions as light shielding films.

However, no effective means has yet been disclosed for a structure in which the luminescence threshold voltage is adjusted and in which crosstalk of light is circumvented at the same time.

SUMMARY OF THE INVENTION

An object of the present invention is to provide a multicolor electroluminescent device of a flat-panel display type which comprises luminescent regions whose luminescence threshold voltage is adjusted, and, at the same time, in which crosstalk of light between the luminescent regions is avoided.

An electroluminescent device according to a first aspect of the present invention comprises two or more types of luminescent portions which differ in luminescent color and are provided in a flat panel arrangement to produce a luminescent layer, and is characterized by the following: a first dielectric film for partitioning the luminescent layer by the luminescent portions, disposed between the two or more types of luminescent portions; a second dielectric film for adjusting the luminescence threshold voltage, disposed selectively on the light outgoing side or on the side opposite thereto of one of the luminescent portions, wherein the first and second dielectric films are made of the same material which has a refractive index lower than that of the respective luminescent portions.

Thus, the luminescence threshold voltage of the luminescent portion having thereon the second dielectric film can be adjusted by means of the selectively disposed second dielectric film. Accordingly, the luminescence threshold voltage can be set at the same value by properly selecting the placement of the second dielectric film in accordance with the difference in the luminescence threshold voltage for the two or more luminescent portions.

In the case that one of the luminescent portions is emitting light, the light from the luminescent portion is provided as a light incident at a predetermined angle to the first dielectric film compartmentalizing the luminescent portion. However, because the luminescent portions are isolated from each other by the first dielectric film, and because the refractive index for the light in the first dielectric film is set lower than that in each of the luminescent portions, in case the incident angle exceeds a predetermined value, the light from one of the luminescent portion incident to the first dielectric film is totally reflected and returned to the initial luminescent portion side. Thus, the generation of crosstalk can be minimized. Moreover, the luminescent portion has fine irregularities on the surface thereof. The returning light above is allowed to undergo irregular reflection, and is reused as the display light of the luminescent portion.

Furthermore, according to the present invention, the first and second dielectric films are made of the same material. Therefore, a structure in which layers of different types are arranged in a complicated manner is not necessitated. Thus, an electroluminescent device improved in reliability and durability can be obtained. This aspect is advantageous from the viewpoint of the fabrication process and cost because the first and second dielectric films can be provided simultaneously with a single film.

The first dielectric film disposed between the luminescent portions eliminates the steps ascribed to spaces between the luminescent portions, and prevents breakdown from propagating to the neighboring luminescent portions. More specifically, in case a space is formed between the luminescent portions, a step corresponding to the film thickness of the luminescent portion develops so as to impair the coverage of the insulating layer that is formed on the upper surface of the luminescent portions. However, the step can be prevented from developing by forming the first dielectric film. Moreover, in the case in which the luminescent portions are connected with each other, a minute breakdown which develops on a luminescent portion may propagate to the neighboring luminescent portions. The propagation of breaking points can be prevented from occurring by forming the first dielectric film.

Furthermore, by selecting the relationship between the dielectric constant of the second dielectric film and that of the luminescent portion on which the second dielectric film is formed, the luminescence threshold voltage of the two luminescent portions can be properly adjusted.

Further, it is preferable to make the total thickness of the luminescent portion having thereon the second dielectric film and the second dielectric film approximately equal to the film thickness of the other luminescent portion. By doing so, in the case of forming an insulating film on the upper side of the luminescent portions (luminescent layer), the surface of the luminescent layer composed of luminescent portions can be made approximately planar. The reliability and durability of the electroluminescent device can be therefore improved. In this case, the film thickness of one of the luminescent portions is reduced to less than the film thickness of the other luminescent portion by the film thickness of the second dielectric film. This results in a decrease of luminance in one of the luminescent portions. Accordingly, as well as making the luminescence threshold voltage of one of the luminescent portions equal to the luminescence threshold voltage of the other luminescent portion, the second dielectric film makes it possible to obtain a uniform luminance over the entire device. Thus a device which is advantageous as a multicolor electroluminescent device is obtained.

Furthermore, even in case the luminance of one of the luminescent portions is lowered to cause uneven luminescence because of the provision of the second dielectric film, by providing a color filter so as to be placed on the light outgoing side of the other luminescent portion to attenuate the light component of a specific wavelength, a well balanced luminance can be achieved.

A preferable thickness necessary for adjusting the luminescence threshold voltage by the second dielectric film is in a range of from 50 to 200 nm.

Materials suitable for use as the dielectric film for adjusting the luminescence threshold voltage include SiON, $Ta_2O_5$, $Cr_2O_3$, IrO, $Ir_2O_3$, and $Cu_2O$. Particularly, a desirable dielectric constant can be achieved by adding at least one of $Al_2O_3$, $SiO_2$, $Y_2O_3$, $WO_3$, $Nb_2O_5$, etc., as an additive material into a matrix of at least one material selected from $Ta_2O_5$, $Cr_2O_3$, IrO, $Ir_2O_3$, $Cu_2O$, etc, which makes it possible to set a desired luminescence threshold voltage.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

The present invention is described in further detail below referring to the preferred embodiments. It should be understood, however, that the present invention is not to be construed as being limited to the examples below.

EXAMPLE 1

Figure 1:
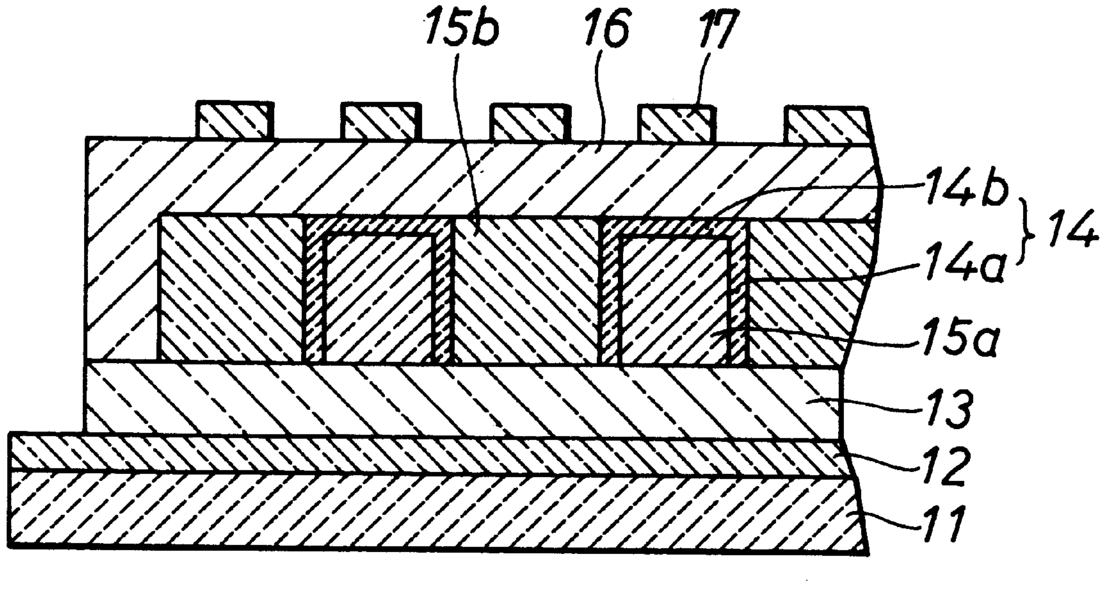
FIG. 1 shows a schematically drawn cross sectional view of a constitution of an electroluminescent device according to a first embodiment of the present invention.

FIG. 1 is a schematically drawn cross sectional view of an electroluminescent device according to the present invention. On a transparent glass substrate 11, a first transparent electrode 12 is formed, and thereon a first insulating layer 13 is formed. A first luminescent portion 15*a* is placed selectively on the first insulating layer 13, and a second luminescent portion 15*b* is formed on the same plane with a dielectric film 14*a* for isolating the luminescent portions interposed therebetween. That is to say, a single-layer luminescent layer is composed of a plurality of the first and second luminescent portions 15*a* and 15*b*, and the dielectric film 14*a* partitions the luminescent layer into luminescent portions. A dielectric film 14*b* for adjusting luminescence threshold voltage is formed on the upper side of the first luminescent portion 15*a*. Here, the dielectric film 14*a* for isolating the luminescent portions and the dielectric film 14*b* for adjusting luminescence threshold voltage are formed of the same material in such a manner to cover the first luminescent portion 15*a*, and the upper surface of the dielectric film 14*b* for adjusting luminescence threshold voltage and the upper surface of the second luminescent portion 15*b* are formed to give a planarized surface at the same height. A second insulating layer 16 is formed thereon to entirely cover the resulting structure, and a second electrode 17 is placed to each of the luminescent portions.

In the case that the same voltage is applied to both of the luminescent portions of the electroluminescent device, when $\epsilon 1 > \epsilon r$, where $\epsilon 1$ is the dielectric constant of the first luminescent portion 15*a* and $\epsilon r$ represents the dielectric constant of the dielectric film 14*b* for adjusting luminescence threshold voltage, the voltage applied to the first luminescent portion 15*a* decreases as compared with that applied to the second luminescent portion 15*b* by a quantity corresponding to the partial voltage imparted to the dielectric film 14*b* which is formed on the first luminescent portion 15*a*. However, in the case in which the luminescence threshold voltage of the first luminescent portion 15*a* is lower than that of the second luminescent portion 15*b*, the practical luminescence threshold voltage becomes equal.

On the contrary, when $\epsilon 1 < \epsilon r$, if the same voltage is applied to the both luminescent portions of the electroluminescent device, the voltage applied to the first luminescent portion 15*a* increases as compared with that applied to the second luminescent portion 15*b* by a quantity corresponding to the partial voltage imparted to the dielectric film 14*b* which is formed on the first luminescent portion 15*a*. However, in case the luminescence threshold voltage of the first luminescent portion 15*a* is higher than that of the second luminescent portion 15*b*, the practical luminescence threshold voltage becomes equal.

Because the luminescent portions are isolated from each other by the dielectric film 14*a* formed in the vertical direction, in the case in which breakdown occurs with a particular luminescent portion, the breakdown does not propagate to the neighboring luminescent portions. Furthermore, if the refractive index for the dielectric film 14*a* disposed between the luminescent portions is lower than that of the luminescent layer, crosstalk of light between the luminescent portions can be eliminated.

FIGS. 2A to 2G illustrate an example of the process for fabricating a multicolor electroluminescent device shown in FIG. 1, as is described in detail below.

A first electrode 12 of a transparent ITO (indium tin oxide) is deposited by means of DC diode sputtering on a glass substrate 11 provided as an insulating substrate. More specifically, a 200 nm thick film is deposited by using ITO as a target and applying the sputtering power while heating the glass substrate 11 inside a film deposition furnace whose atmosphere is maintained at a constant pressure and into which gaseous argon (Ar) and oxygen ($O_2$) are introduced as sputtering gases. The resulting film is patterned into a desired shape by means of a well known method of photolithography.

Figure 2A:
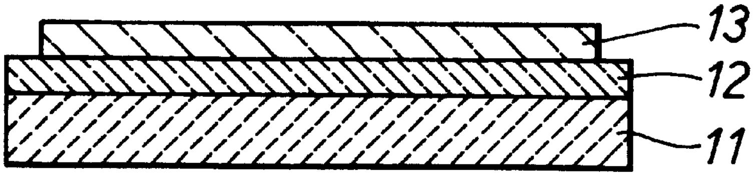
FIGS. 2A to 2G are views showing schematically drawn process steps in fabricating an electroluminescent device according to the first embodiment.

A first insulating layer 13 is then deposited by means of RF diode sputtering. More specifically, a 400 nm thick film is deposited by using a target containing tantalum pentaoxide ($Ta_2O_5$) as the principal component with 6% by weight of alumina ($Al_2O_3$) added therein, introducing a mixed gas of argon and oxygen as the sputtering gas, and applying high frequency power while heating the glass substrate under a constant pressure (FIG. 2A).

Figure 2B:
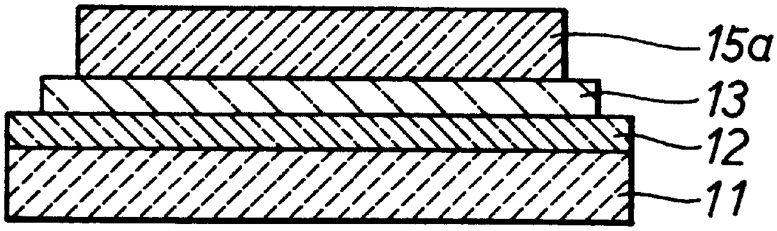

A ZnS:Mn film 15*a* is deposited thereafter to a film thickness of 450 nm by means of sputtering or evaporation. More specifically, if an evaporation system is employed, electron beam evaporation is employed by using a manganese added zinc sulfide (Mn-incorporated ZnS) pellet as the evaporation material while heating the glass substrate 11. In the case in which RF diode magnetron sputtering system is employed, a mixed gas of argon and helium is introduced as the sputtering gas while using a Mn-incorporated ZnS sintered material as the target (FIG. 2B).

Figure 2C:
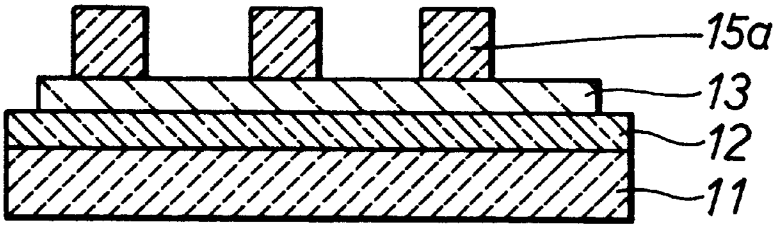

A first luminescent portion 15*a* is formed thereafter by patterning the resulting ZnS:Mn film 15*a* by means of photolithography (FIG. 2C).

Figure 2D:
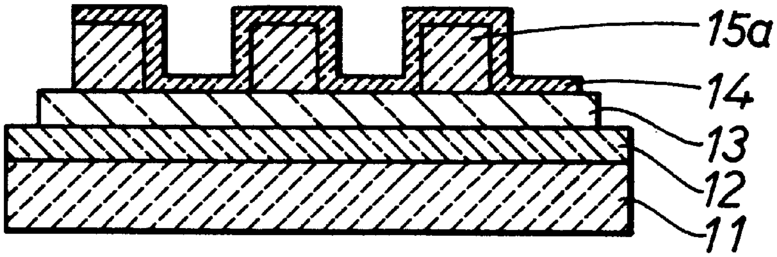

Then, a silicon oxynitride (SiON) layer 14 is deposited on the first luminescent portion 15*a* and the aperture region to provide the dielectric film 14*a* for isolating the luminescent portions and the dielectric film 14*b* for adjusting the luminescence threshold voltage. More specifically, the SiON film 14 is deposited at a thickness of 100 nm by performing reactive RF magnetron sputtering using silicon (Si) as the target at a substrate temperature of 300° C., while applying power at a density of 3.1 W/cm$^2$ and flowing mixed gas at a rate of 105 SCCM for argon (Ar), 5 SCCM for oxygen ($O_2$), and 40 SCCM for nitrogen ($N_2$) (FIG. 2D).

Figure 2E:
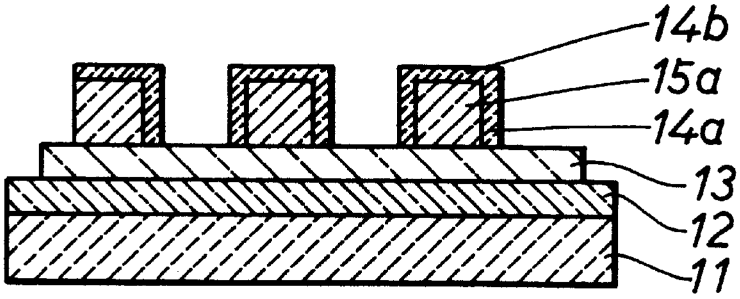

The first luminescent portion 15*a* thus formed is then covered with a photoresist (not shown) by means of photolithography, and the region of the dielectric film 14 covering no first luminescent portion 15*a* (i.e., a region where the dielectric film 14 contacts directly with the first insulating layer 13) is removed by means of dry etching using a mixed gas of carbon tetrafluoride ($CF_4$) and oxygen ($O_2$) (FIG. 2E).

Figure 2F:
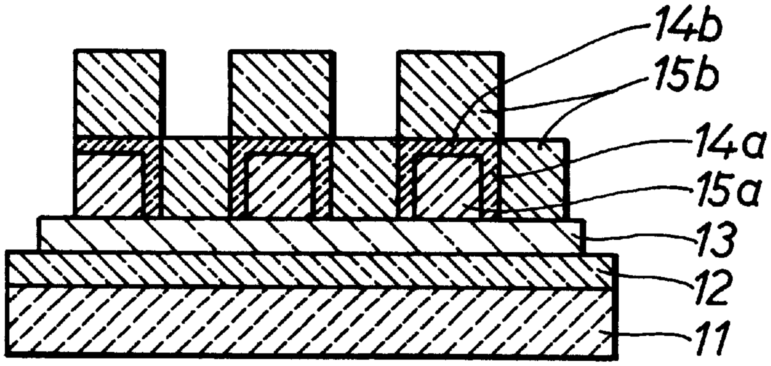

A ZnS:TbOF film is deposited thereafter as a second luminescent portion 15*b* by means of RF magnetron sputtering. More specifically, a 550 nm thick film is deposited by means of sputtering under a high frequency electric power using a terbium added zinc sulfide (TbOF-incorporated ZnS) sintered material as the target and introducing a mixed gas of argon (Ar) and helium (He) as the sputtering gas, while maintaining the pressure inside the chamber constant and heating the glass substrate 11 (FIG. 2F).

Figure 2G:
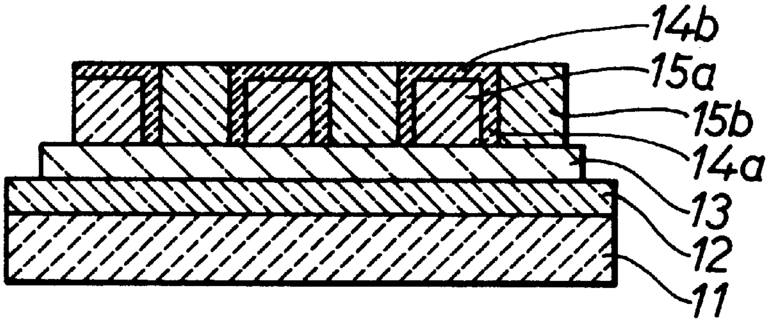

The second luminescent portion 15*b* deposited on the dielectric film 14*b* (that is present on the first luminescent portion 15*a*) is removed by means of photolithography (FIG. 2G). At this time, the dielectric film 14*b* provided on the first luminescent portion 15*a* functions as an etching stopper, and prevents progressive damage from occurring on the first luminescent portion 15*a* due to etching.

Then, a second insulating layer 16 is formed on the dielectric film 14*b* and the second luminescent portion 15*b*. In this example, a 100 nm thick SiON film is deposited in the same manner as in the case of forming the dielectric film 14, and a 300 nm thick composite film of tantalum pentaoxide and alumina ($Ta_2O_5$:$Al_2O_3$) is formed in the same manner as that employed in forming the first insulating layer 13. Thus, a double-layer structured second insulating layer 16 is obtained.

A transparent second electrode 17 is deposited thereafter on the resulting structure by ion plating. More specifically, a film is deposited by applying a high frequency electric power of 40 W while heating the glass substrate 11 to 250° C. while maintaining the pressure inside the deposition chamber at 0.04 Pa by introducing gaseous argon (Ar), and using a pellet of zinc oxide (ZnO) containing gallium oxide ($Ga_2O_3$) as the evaporation material. The resulting film is patterned as desired by means of photolithography to obtain a second electrode 17. The second electrode 17 can be obtained otherwise by forming an ITO electrode by means of DC diode sputtering.

The multicolor electroluminescent device shown in FIG. 1 is thus fabricated. Although the first insulating layer 13 and the second insulating layer 16 are formed by using a tantalum pentaoxide film containing alumina ($Ta_2O_5$:$Al_2O_3$) and a composite film of a SiON film and a $Ta_2O_5$:$Al_2O_3$ film, respectively, also usable are mono-layer films of $Ta_2O_5$, $Al_2O_3$, $Si_3N_4$, $SiO_2$, SiON, $PbTiO_3$, $Y_2O_3$, or $SrTiO_3$, or a composite film comprising above as the principal components, or a film laminate thereof.

The clump electric field intensity Ev1 of the ZnS:Mn film provided as the first luminescent portion 15*a* is about 1.5 MV/cm; the specific dielectric constant $\epsilon 1'$ of the film is about 10.5, and the refractive index $\eta 1$ is in a range of from 2.3 to 2.4.

The clump electric field intensity Ev2 of the ZnS:TbOF film provided as the second luminescent portion 15*b* is about 1.8 MV/cm; the specific dielectric constant $\epsilon 2'$ of the film is about 8.5, and the refractive index $\eta 2$ is in a range of from 2.3 to 2.4.

Concerning the silicon oxynitride (SiON) film provided as the dielectric film 14*a* for isolating the luminescent portions and the dielectric film 14*b* for adjusting luminescence threshold voltage, a specific dielectric constant $\epsilon r'$ of about 5.8 and a refractive index $\eta r$ in a range of from 1.5 to 1.6 is obtained.

That is, the dielectric constants for the first luminescent portion 15*a* and the dielectric film 14*b* for adjusting the luminescence threshold voltage are related with each other by $\epsilon 1 > \epsilon r$, and as compared with a case where the first luminescent portion 15*a* is provided at the same thickness as that of a second luminescent portion 15*b*, the voltage (partial voltage) applied to the first luminescent portion 15*a* is lowered by a value corresponding to the portion partially replaced by the dielectric film 14*b* for adjusting luminescence threshold voltage. However, because the luminescence threshold voltage (which depends on the clump electric field intensity and the dielectric constant of the luminescent portion) of the first luminescent portion 15*a* in this case is lower than that of the second luminescent portion 15*b*, the actual luminescence threshold voltage becomes equivalent to that of the second luminescent portion 15*b* in a range of from 185 to 190 V.

In other words, the dielectric film 14*b* for adjusting luminescence threshold voltage increases the luminescence threshold voltage of an electroluminescent device on the side of the first luminescent portion 15*a*. More specifically, the increase in voltage is about 12 V after subtracting the effect of thinning the first luminescent portion 15*a*.

The ZnS:Mn first luminescent portion 15*a* yields a higher luminance as compared with the ZnS:TbOF second luminescent portion 15*b* not only in the case in which the same voltage is applied to the portions provided at the same thickness, but also in the case in which the same voltage is applied from the luminescence threshold voltage (that is, a voltage higher by the difference in luminescence threshold voltages of the ZnS:TbOF and ZnS:Mn is applied to ZnS:TbOF). However, because the ZnS:Mn film provided is thinner than the ZnS:TbOF film, the luminance of ZnS:Mn can be suppressed to a low level to realize a well-balanced luminance.

Furthermore, because the refractive index $\eta r$ of the dielectric film 14*a* placed between the luminescent portions 15*a* and 15*b* is lower than the refractive indices ($\eta 1$, $\eta 2$) of the luminescent portions, i.e., $\eta r<\eta 1$ or $\eta 2$, the crosstalk or light between the luminescent portions can be avoided.

Figure 7:
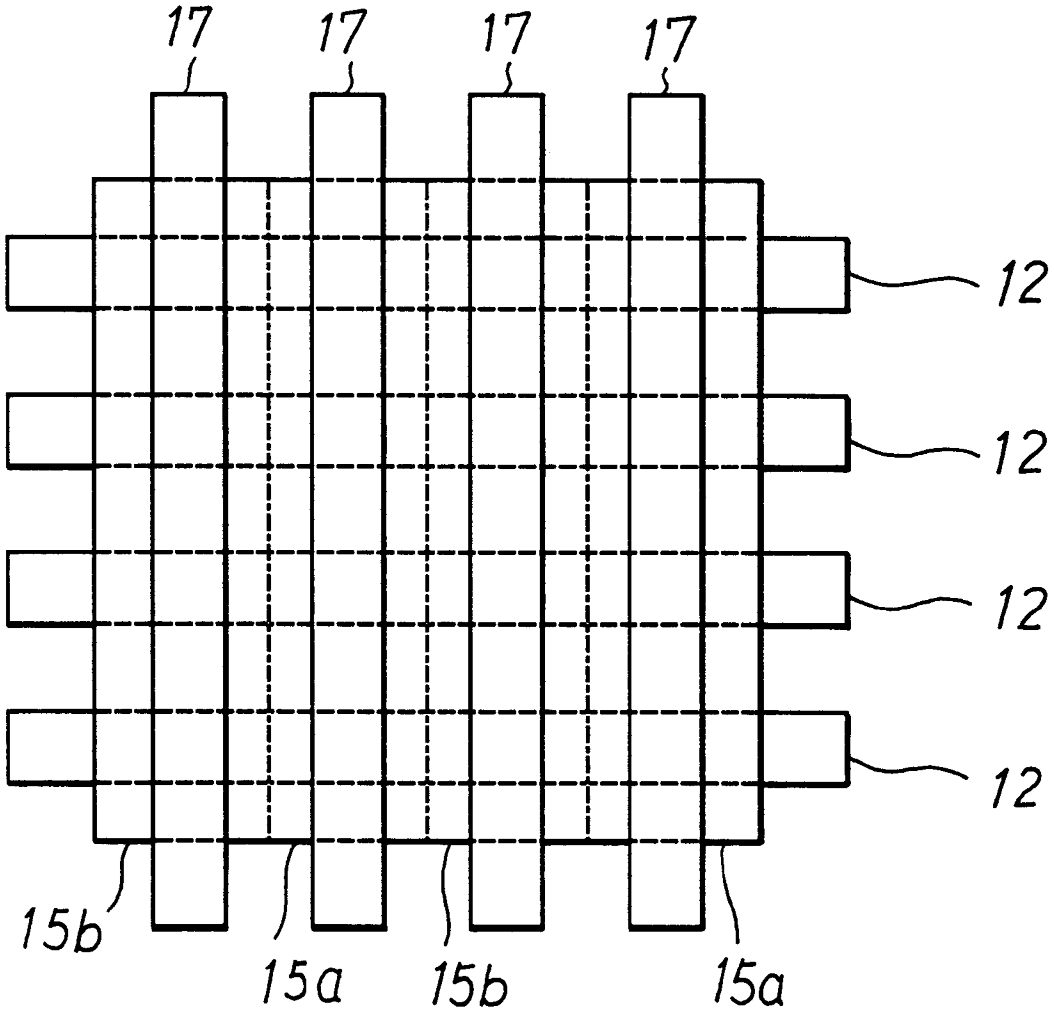
FIG. 7 shows a schematically drawn plan view of an electroluminescent device of dot-matrix type.

Furthermore, the electroluminescent device of the first embodiment comprises a plurality of the first luminescent portions 15*a* of ZnS:Mn and a plurality of the second luminescent portions 15*b* of ZnS:TbOF alternately arranged in the same plane in such a manner that the adjoining first and second luminescent portions form a pixcel. More specifically, as shown in FIG. 7, which shows a schematic plan view of the electroluminescent device of dot-matrix type, neighboring luminescent regions, which are regions sandwiched between the neighboring pair of second electrode lines 17 and underlying one first electrode line 12 in the neighboring luminescent portions 15*a* and 15*b*, respectively, form a pixel.

EXAMPLE 2

Figure 3:
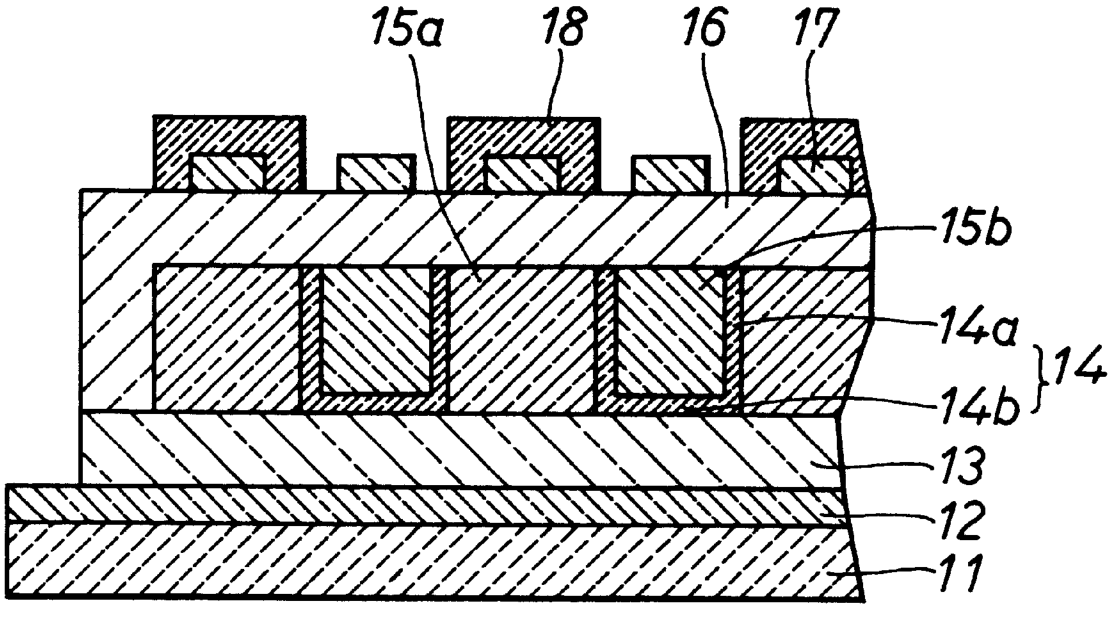
FIG. 3 shows a schematically drawn cross sectional view of a constitution of an electroluminescent device according to a second embodiment of the present invention.

FIG. 3 shows a schematically drawn cross sectional structure of an electroluminescent device according to another embodiment of the present invention. As can be illustrated in FIG. 3, the electroluminescent device comprises a transparent glass substrate 11 having thereon a first transparent electrode 12, and a first insulating layer 13 formed further thereon. A first luminescent portion 15*a* composed of ZnS:Mn is placed selectively on the first insulating layer 13, and a second luminescent portion 15*b* of ZnS:TbOF is formed on the same plane in a fitted manner with a dielectric film 14*a* for isolating the luminescent portions and a dielectric film 14*b* for adjusting luminescence threshold voltage being interposed. The upper surface of each of the luminescent portions are planarized. That is to say, a single-layer luminescent layer is composed of a plurality of the first and second luminescent portions 15*a* and 15*b*, the dielectric film 14*a* makes the luminescent layer partitioned by the luminescent portions, and the dielectric film 14*b* underlies only the second luminescent portion 15*b*. A second insulating layer 16 is formed on the luminescent layer in such a manner to completely cover the luminescent portions. A second electrode 17 is placed to each of the luminescent portions, and a filter 18 for controlling color purity is formed on the region of a second electrode 17 corresponding to the region of first luminescent portion 15*a*.

The constitution of the present example differs from that of Example 1 mainly in the fabrication process. As a result, in the present constitution, the dielectric film 14*b* for adjusting luminescence threshold voltage is formed on the lower side of the second luminescent portion 15*b*.

The effect of setting the relation between the dielectric constants $\epsilon r$ and $\epsilon 2$, i.e., those of the dielectric film 14*b* for adjusting luminescence threshold voltage and the second luminescent portion 15*b*, respectively, to $\epsilon 2<\epsilon r$ is described below.

The case above can be regarded as a case in which a part of the second luminescent portion 15*b* is replaced by the dielectric film 14*b* for adjusting luminescence threshold voltage, which has a higher dielectric constant. Accordingly, the voltage (partial voltage) increases by a value corresponding to the replaced quantity as compared with the case the entire portion is a second luminescent portion 15*b*. That is, the light emission can be triggered at a lower voltage. However, because the initial luminescence threshold voltage of the second luminescent portion 15*b* (ZnS:TbOF) in this case is higher than that of the first luminescent portion 15*a* (ZnS:Mn), the actual luminescence threshold voltage becomes equal to that of the first luminescent portion 15*a*.

In other words, it can be said that the dielectric film 14*b* for adjusting luminescence threshold voltage lowers the luminescence threshold voltage of the electroluminescent device on the side of the second luminescent portion 15*b*.

However, the constitution in this case differs from that of Example 1 in that the ZnS:Mn first luminescent portion 15*a* is thicker than the ZnS:TbOF second luminescent portion 15*b*. Accordingly, even if the luminescence threshold voltage should be the same for both, the luminance of the electroluminescent device on the ZnS:Mn side is further increased as compared with that of the electroluminescent device on the ZnS:TbOF side.

Thus, by forming a red color filter 18 only on the surface of the second electrode 17 corresponding to the region of ZnS:Mn first luminescent portion 15*a*, a constitution having a well balanced luminance for the electroluminescent devices in the ZnS:Mn and the ZnS:TbOF sides can be implemented. For instance, if a yellowish orange light emitted from ZnS:Mn is passed through a red color filter 18 which cuts off spectrum in a wavelength region of 590 nm or less, the luminance of the resulting light can be attenuated to about 20% of the initial luminance of the yellowish orange color light. By thus employing the constitution above, not only a balanced luminance is obtained, but also red color with rich hue is realized. Thus, a considerably increased variation can be realized in colors ranging from red to green.

As may be seen illustrated in FIGS. 4A to 4F, the process for fabricating a multicolor electroluminescent device according to another embodiment of the present invention is described in detail below.

In the same manner as in Example 1, a 200 nm thick transparent ITO first electrode 12 is deposited by means of DC diode sputtering on a glass substrate 11 provided as an insulating substrate. The resulting film is patterned into a desired shape by means of photolithography.

Figure 4A:
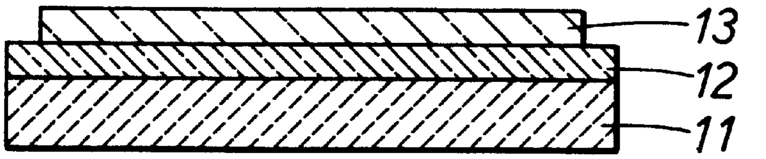
FIGS. 4A to 4F are views showing schematically drawn process steps in fabricating an electroluminescent device according to the second embodiment.

A first insulating layer 13 is then formed in the same manner as in Example 1 by depositing a composite film of tantalum pentaoxide and alumina ($Ta_2O_5$:$Al_2O_3$) to a thickness of 400 nm (FIG. 4A).

Figure 4B:
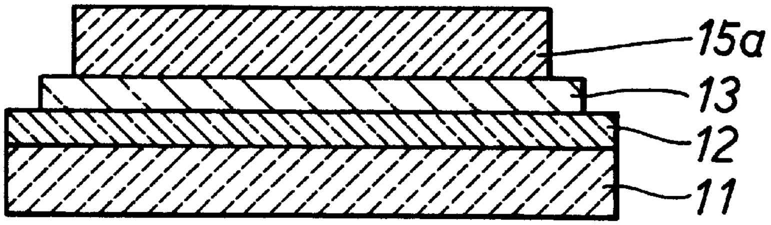

A ZnS:Mn film is deposited thereafter as a first luminescent portion 15*a* in the same manner as in Example 1, except that it is deposited to attain a film thickness of 650 nm (FIG. 4B).

Figure 4C:
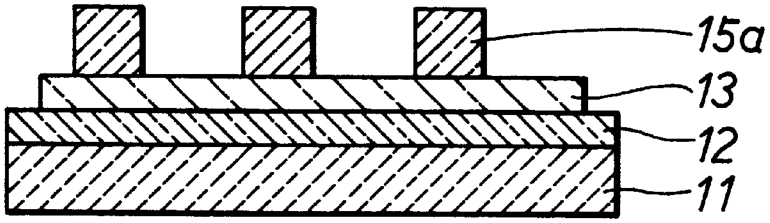

The resulting ZnS:Mn luminescent film 15*a* is patterned thereafter by means of photolithography to obtain a first luminescent portion 15*a* having the predetermined layout (FIG. 4C).

Figure 4D:
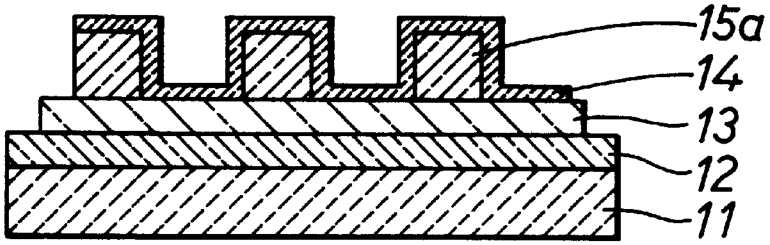

Then, a tantalum pentaoxide ($Ta_2O_5$) layer 14 is deposited over the first luminescent portion 15*a* and the aperture region to provide the dielectric film 14*a* for isolating the luminescent portions and the dielectric film 14*b* for adjusting the luminescence threshold voltage. More specifically, the $Ta_2O_5$ film 14 is deposited at a thickness of 150 nm under a constant pressure by performing sputtering using sintered $Ta_2O_5$ as the target, while heating the substrate to a temperature of 300° C., applying high frequency power at a density of 4.1 W/cm$^2$, and flowing mixed gas at a rate of 140 SCCM for argon (Ar) and 60 SCCM for oxygen ($O_2$) (FIG. 4D).

Figure 4E:
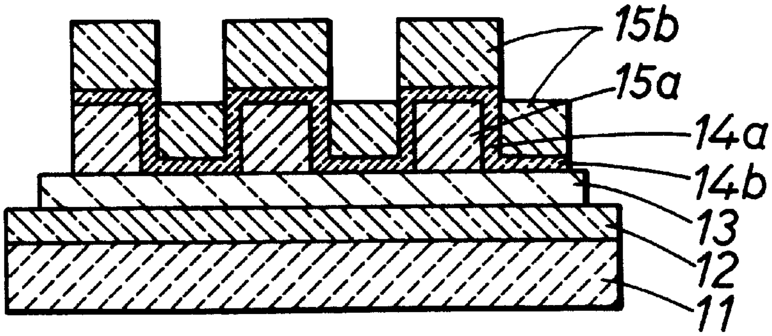

In the same manner as in Example 1, a 500 nm thick ZnS:TbOF layer is deposited thereafter as a second luminescent portion 15*b* by means of RF diode sputtering (FIG. 4E).

Figure 4F:
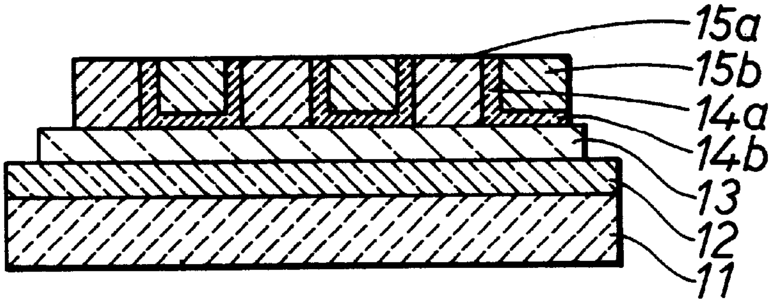

The resulting glass substrate 11 is wholly immersed in water to wash away the tantalum pentaoxide ($Ta_2O_5$) layer and thereby lift-off the unnecessary second luminescent portion 15*b* provided on the first luminescent portion 15*a*. This can be realized because a thin layer of zinc sulfate ($ZnSO_4$) is formed on the interface when the tantalum pentaoxide layer 14 is formed on the first luminescent portion 15*a* in a gaseous oxygen atmosphere. The thin zinc sulfate layer can be readily dissolved into water when the glass substrate 11 is immersed in water. Thus, the tantalum pentaoxide layer 14 deposited above the first luminescent portion 15*a* is peeled off from the first luminescent portion 15*a*, and thereby the tantalum pentaoxide layer 14 is lifted off together with the unnecessary second luminescent portion 15*b* deposited over the first luminescent portion 15*a* (FIG. 4F). Here, water brought into contact with the surfaces of the first luminescent portion 15*a* and the second luminescent portion 15*b* raises no harmful effect on the luminescent portions. Also, because the second luminescent portion 15*b* is fitted between the first luminescent portions 15*a*, the tantalum pentaoxide layer 14 existing between the first and second luminescent portions 15*a* and 15*b*, i.e., the dielectric film 14*a* for isolating the luminescent portions is not peeled off.

The resulting structure is then subjected to heat treatment in vacuum to improve the crystallinity of the luminescent portions 15*a* and 15*b*. A 100 nm thick SiON film and a 300 nm thick composite film of tantalum pentaoxide and alumina ($Ta_2O_5$:$Al_2O_3$) are formed on each of the luminescent portions to provide a double-layered second insulating layer 16 in the same manner as in Example 1.

A transparent second electrode 17 made of zinc oxide (ZnO:$Ga_2O_3$) is deposited thereafter by ion plating in the same manner as in Example 1, and photolithography is effected to obtain a second electrode 17 patterned into a desired shape.

Finally, a photosensitive resist containing a red dye dissolved therein is applied to the transparent second electrode 17. Then, the resist is removed by means of photolithography from portions except for the region on the transparent second electrode 17 corresponding to the first luminescent portion 15*a*. A red color filter 18 is formed in this manner (FIG. 3).

The tantalum pentaoxide ($Ta_2O_5$) layer 14 employed for the dielectric film 14*a* for isolating the luminescent portions and the dielectric film 14*b* for adjusting the luminescence threshold voltage herein has a specific dielectric constant $\epsilon r'$ of about 23, and the refractive index $\eta r$ thereof is in a range of from 2.0 to 2.1. However, the dielectric film 14 is not only limited to a tantalum pentaoxide ($Ta_2O_5$) layer, and other usable dielectric materials include $Cr_2O_3$, IrO, $Ir_2O_3$, or $Cu_2O$. The relationship in the dielectric constant of the luminescent layer and the dielectric film is important for obtaining the desired luminescence threshold voltage. In order to obtain the desired luminescence threshold voltage, other additives, such as $Al_2O_3$, $SiO_2$, $Y_2O_3$, $WO_3$, or $Nb_2O_5$, may be added into the oxide dielectric materials above to control the dielectric constant thereof. For instance, the composite film of tantalum pentaoxide and alumina ($Ta_2O_5$:$Al_2O_3$) used as the first insulating layer 13 yields a specific dielectric constant $\epsilon r'$ of about 17 and a refractive index $\eta r$ in a range of from 1.9 to 2.0. Thus, it can be safely used as the dielectric film 14*a* for isolating the luminescent portions and the dielectric film 14*b* for adjusting the luminescence threshold voltage.

The oxide dielectric film above comprises a metal oxide which forms a hydroxyl group ($OH^-$), or is capable of taking a structure containing water ($H_2O$). Thus, water can be introduced through the dielectric film to zinc sulfate ($ZnSO_4$) and the like that is formed on the surface of the luminescent layer. The lift off of the unnecessary second luminescent portion can be further facilitated. The process of fabrication in the present example is economically advantageous as compared with that described in Example 1, because the photoetching steps can be omitted two times. The key of this process is that, when a dielectric film for isolation as well as adjusting the luminescence threshold voltage is formed, a water-soluble product is formed in the interface between the preformed luminescent portion and the dielectric film, and that the formed dielectric film inherently has a permeable character to water, a chemical solution, etc.

Even if a water-soluble product may be formed at the interface between the luminescent portion and dielectric film, the film cannot be lifted off so long as a dense and impermeable film having no path for introducing water, a chemical solution, etc., is formed. A thin film, for instance, a film 10 nm or less in thickness, may be provided with numerous pin holes to facilitate the film to be lifted off. However, the film is too thin that a dynamic adjustment of the luminescence threshold voltage is unfeasible. To favorably adjust the luminescence threshold voltage, a film having a thickness of at least 50 nm is necessary. Furthermore, to assure a favorable luminance, the film thickness must be limited to about 200 nm at most. The oxide dielectric film above allows water to move inside the structure via hydroxyl groups ($OH^-$) and the like. Accordingly, water can be introduced inside a relatively thick film, and no additional pinhole is necessary for the film. Further, a porous dielectric film, which can form the water-soluble product on the above interface, may be applicable as the dielectric film 14.

If zinc oxide (ZnO) is formed in the interface between the first luminescent portion 15*a* and the tantalum pentaoxide ($Ta_2O_5$) layer 14 instead of zinc sulfate ($ZnSO_4$), the resulting thin film of zinc oxide (ZnO) readily dissolves into a weak acid such as acetic acid. Accordingly, the unnecessary second luminescent portion 15*b* and the underlying tantalum pentaoxide ($Ta_2O_5$) layer 14 can be lifted off and removed.

EXAMPLE 3

The structure of the present example is characterized in that the dielectric film 14*a* for isolating the luminescent portions and the dielectric film 14*b* for adjusting the luminescence threshold voltage are made of the same film material. The effect of the dielectric films, and particularly that of the dielectric film 14*b* for adjusting the luminescence threshold voltage is described in detail in the foregoing Examples 1 and 2.

Figure 5:
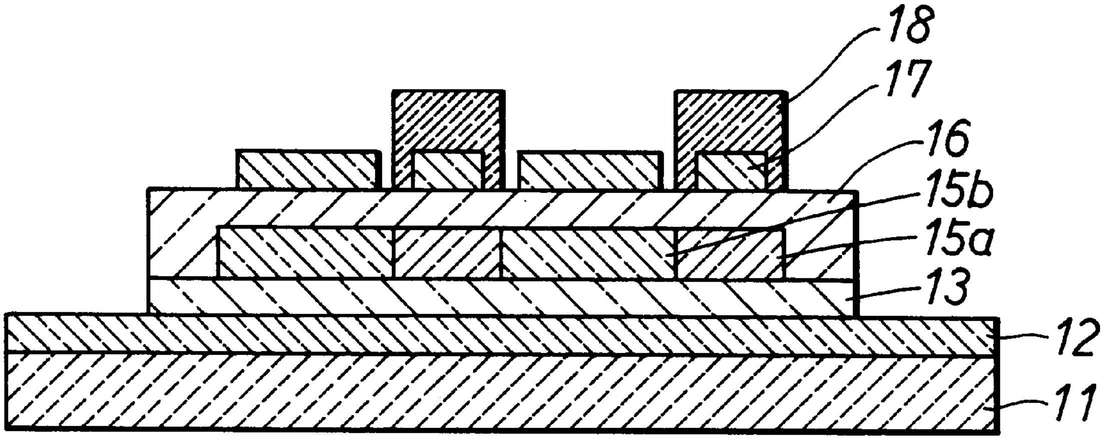
FIG. 5 shows a schematically drawn cross sectional view of a constitution of an electroluminescent device A provided as a comparative sample with reference to Example 3.
Figure 6:
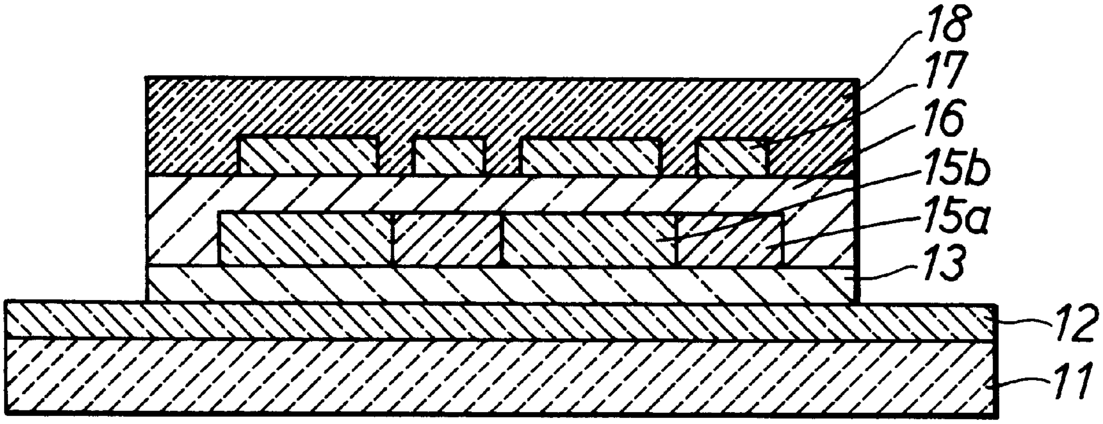
FIG. 6 shows a schematically drawn cross sectional view of a constitution of an electroluminescent device B provided as another comparative sample with reference to Example 3.

The present example shows the effect of the dielectric film 14*a* for isolating the luminescent portions, and particularly, the effect in preventing crosstalk of emitted light from occurring. Comparative samples as are illustrated in FIGS. 5 and 6 are fabricated, and are compared with a structure according to Example 2 (FIG. 3).

The comparative sample A (FIG. 5) has a structure obtained by omitting the dielectric film 14*a* for isolating the luminescent portions and the dielectric film 14*b* for adjusting the luminescence threshold voltage from the structure described in Example 2 with reference to FIG. 3. The first luminescent portion 15*a* and the second luminescent portion 15*b* are formed in direct contact with each other, and are each formed in stripes. Similar to Example 2, a red color filter 18 is formed in stripes on the second electrode 17 at regions corresponding to those for forming the ZnS:Mn first luminescent portion 15*a*.

The comparative sample B (FIG. 6) has the same structure as that of comparative sample A, except that a red color filter 18 is formed in such a manner that it entirely covers the second electrode 17.

In the structure for the constitution described in Example 2 with reference to FIG. 3, the red-emitting light is obtained by passing the light emitted from the ZnS:Mn first luminescent portion 15*a* through a red color filter 18, and a green-emitting light can be obtained by the light emitted from the ZnS:TbOF second luminescent portion 15*b*. Similarly, red- or green-color emitting light is obtained in comparative sample A (FIG. 5) by basically the same manner as above, although differing in the luminescence threshold voltage for red- and green-light. The comparative sample B is similar to the comparative sample A in that the red-color emitting light is taken out via a red-color filter 18, but is different in that the green-emitting light emitted from the second luminescent portion 15*b* (ZnS:TbOF) is cut off by the red color filter 18, and is not taken out in the comparative sample B (FIG. 6).

Each color purity of the three electroluminescent devices above is measured for the case red color alone is emitted. The results are given in Table 1. In the table, x and y represents the chromaticity coordinates for the C.I.E. chromaticity diagram according to Commission Internationale del'Eclairage (CIE). The color purity of red color increases (approaches the true red color) with increasing x value and with decreasing y value.

TABLE 1

| | Color Purity | |
|---|---|---|
| Structure | x | y |
| FIG. 3 | 0.62 | 0.37 |
| FIG. 5 | 0.60 | 0.39 |
| FIG. 6 | 0.62 | 0.37 |

It can be seen from the result that the structure according to an embodiment of the present invention (Example 2) with reference to FIG. 3 yields the same value as sample B (FIG. 6), but that sample A (FIG. 5) yields poor red color purity.

In sample A (FIG. 5), the first and the second luminescent portions are connected, and they yield the same refractive index of about 2.36. Thus, when red color light is emitted (i.e., when voltage is applied to the second electrode 17 on ZnS:Mn alone), radiated light is emitted not only to the display side, but also to the planar direction (i.e., to the direction perpendicular to the display plane) of the luminescent layer. A part of the light which proceeds inside the luminescent layer in the planar direction changes its direction due to the presence of grain boundaries and the like inside the luminescent layer, and is radiated to the display plane. The radiant light of this type does not pass the filter and is directly emitted from ZnS:Mn. Hence, a light component with yellowish orange color is mixed with the red color to lower the red color purity.

In contrast to sample A above, sample B (FIG. 6) comprises a red color filter 18 formed over the entire display plane side. Accordingly, even in case a light which is radiated to the display plane after it travels inside the luminescent layer and changes its direction is present, the light is also emitted after passing the red color filter 18. Thus, the resulting color purity is the true color purity depending on the red color filter 18.

The structure (FIG. 3) according to Example 2 according to the present invention is equipped with a dielectric film 14*a* for isolating the luminescent layers. Because the dielectric film 14*a* for isolating the luminescent layers is made of a substance having a refractive index lower than that of luminescent layer, the light which travels inside the luminescent layer in the planar direction is reflected by the dielectric film 14*a*, and cannot escape to the neighboring ZnS:TbOF luminescent portion 15*b*. Thus, in this case again, assumably, the true color purity depending on the red color filter 18 is obtained.

The results above show that the dielectric film 14*a* for isolating the luminescent portions not only prevents the propagation of breakdown to the neighboring luminescent portions, but also suppresses crosstalk due to dissipation of light in the transverse direction by setting the refractive index of the dielectric film 14*a* lower than that of the luminescent portion. The dielectric film 14*a* for isolating the luminescent portions is particularly effective in case a filter is provided for increasing the color purity of a particular portion.

EXAMPLE 4

The present example relates to a case in which luminescent portions which emit three types or more of radiation differing from each other in color. In this case, the process proceeds in the same manner as in Example 1 to the step of forming two luminescent portions with reference to FIG. 2F. Then, the third luminescent portion, or more luminescent portions, are formed by opening the corresponding region by etching, and the dielectric film is formed similarly in accordance with the steps for forming the luminescent portion shown in FIGS. 2D to 2F. The sequence of these process steps is repeated to obtain a plurality of luminescent portions differing in luminescent color. Because the luminescent portions obtained previously are based on a zinc sulfide (ZnS) matrix, a tantalum pentaoxide ($Ta_2O_5$) layer may be provided to the opened aperture portion in the place a SiON layer to form the third luminescent portion thereon. Thus, a thin film of $ZnSO_4$ can be formed on the interface between the tantalum pentaoxide layer and the first or second luminescent portion based on ZnS matrix, and the unnecessary third luminescent portion can be easily lifted off by employing the process described in Example 2.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for fabricating an electroluminescent device which comprises an insulating substrate having consecutively thereon a first electrode, a first insulating layer, a luminescent layer, a second insulating layer, and a second electrode, wherein an optically transparent material is used on at least a light outgoing side and at least two types of luminescent portions differing in luminescent color are provided in a flat panel arrangement to form said luminescent layer, said method comprising the steps of:

forming a first luminescent film on said first insulating layer;

patterning said first luminescent film to form a first luminescent portion and to establish a region on said first insulating layer having no first luminescent film thereon;

forming a dielectric film on upper and side surfaces of said first luminescent portion, as well as on an exposed surface of said first insulating layer corresponding to said region having no first luminescent film thereon;

removing the dielectric film formed on said first insulating layer corresponding to said region having no first luminescent film thereon;

forming a second luminescent film on a surface of the dielectric film provided on the upper surface of the first luminescent portion and on the exposed surface of the first insulating layer which was exposed by removing the dielectric film; and removing the second luminescent film on the surface of the dielectric film to form a second luminescent portion onto the exposed surface of the first insulating layer.

2. A method for fabricating an electroluminescent device according to claim 1, wherein said second luminescent portion uses zinc sulfide as a host material, and said dielectric film is formed under a gaseous atmosphere containing oxygen.

3. A method for fabricating an electroluminescent device according to claim 2, wherein said dielectric film is formed by sputtering.

4. A method for fabricating an electroluminescent device according to claim 1, wherein said dielectric film disposed between said first and second luminescent portions isolates said first and second luminescent portions from each other, and said dielectric film selectively disposed on said upper surface of said first luminescent portion is to adjust a luminescence threshold voltage of said first luminescent portion.

5. A method for fabricating an electroluminescent device according to claim 4, wherein a dielectric constant of said dielectric film for adjusting said luminescence threshold voltage of said first luminescent portion is lower than that of said first luminescent portion.

6. A method for fabricating an electroluminescent device according to claim 5, wherein a luminescence threshold voltage of said first luminescent portion is lower than that of said second luminescent portion, and said dielectric film having a dielectric constant lower than that of said first luminescent portion increases said luminescent threshold voltage of said first luminescent portion so that said luminescence threshold voltage of said first luminescent portion becomes substantially equal to said luminescence threshold voltage of said second luminescent portion.

7. A method of fabricating an electroluminescent device according to claim 6, wherein a luminance of said first luminescent portion per unit film thickness is higher than that of said second luminescent portion per unit film thickness, and said dielectric film lowers said luminance of said first luminescent portion so that said luminance of said first luminescent portion becomes substantially equal to that of said second luminescent portion.

8. A method for fabricating an electroluminescent device according to claim 7, wherein said first luminescent portion is made of manganese-doped zinc sulfide, and said second luminescent portion is made of a terbium-doped zinc sulfide.

9. A method for fabricating an electroluminescent device according to claim 7, wherein a thickness of said dielectric film formed on said upper surface of said first luminescent portion in between 50 nm and 200 nm.

10. A method for fabricating an electroluminescent device according to claim 6, wherein said first luminescent portion is made of manganese-doped zinc sulfide, and said second luminescent portion is made of a terbium-doped zinc sulfide.

11. A method for fabricating an electroluminescent device according to claim 5, wherein a luminance of said first luminescent portion per unit film thickness is higher than that of said second luminescent portion per unit film thickness, and said dielectric film lowers said luminance of said first luminescent portion so that said luminance of said first luminescent portion becomes substantially equal to that of said second luminescent portion.

12. A method for fabricating an electroluminescent device according to claim 4, wherein said dielectric film for adjusting said luminescence threshold voltage of said first luminescent portion is formed on a side opposite to a light outgoing side of said first luminescent portion.

13. A method for fabricating an electroluminescent device according to claim 1, wherein said dielectric film is made of a material having a refractive index lower than that of both said first and second luminescent portions.

14. A method for fabricating an electroluminescent device according to claim 1, wherein a dielectric constant of said dielectric film for adjusting the luminescence threshold voltage of said first luminescent portion is higher than that of said second luminescent portion.

15. A method for fabricating an electroluminescent device according to claim 14, wherein a luminescence threshold voltage of said first luminescent portion is higher than that of said second luminescent portion, and said dielectric film having a dielectric constant higher than that of said first luminescent portion reduces said luminescent threshold voltage of said first luminescent portion so that said luminescence threshold voltage of said first luminescent portion becomes substantially equal to said luminescence threshold voltage of said second luminescent portion.

16. A method for fabricating an electroluminescent device according to claim 15, wherein a luminance of said first luminescent portion per unit film thickness is lower than that of said second luminescent portion per unit film thickness, and said dielectric film increases said luminance of said first luminescent portion so that said luminance of said first luminescent portion becomes substantially equal to that of said second luminescent portion.

17. A method for fabricating an electroluminescent device according to claim 15, wherein said first luminescent portion is made of terbium-doped zinc sulfide, and said second luminescent portion is made of manganese-doped zinc sulfide.

18. A method for fabricating an electroluminescent device according to claim 14, wherein a luminance of said first luminescent portion per unit film thickness is lower than that of said second luminescent portion per unit film thickness, and said dielectric film increases said luminance of said first luminescent portion so that said luminance of said first luminescent portion becomes substantially equal to that of said second luminescent portion.

19. A method for fabricating an electroluminescent device according to claim 14, further comprising a step of providing a color filter for attenuating light of a predetermined wavelength selectively on a light outgoing side of said second luminescent portion.

20. A method for fabricating an electroluminescent device according to claim 1, wherein a total thickness of said first luminescent portion and said dielectric film is approximately the same as a thickness of said second luminescent portion.

21. A method for fabricating an electroluminescent device according to claim 1, wherein neighboring said first and second luminescent portions differing in luminescent color make up a pixel, a plurality of said pixels collectively form said luminescent layer.

22. A method for fabricating an electroluminescent device which comprises an insulating substrate having consecutively thereon a first electrode, a first insulating layer, a luminescent layer, a second insulating layer, and a second electrode, wherein an optically transparent material is used on at least a light outgoing side and at least two types of luminescent portions differing in luminescent color are provided in a flat panel arrangement to form said luminescent layer, said method comprising the steps of:

forming a first luminescent film on said first insulating layer;

patterning said first luminescent film to form a first luminescent portion and to establish a region on said first insulating layer having no first luminescent film thereon;

forming a dielectric film on upper and side surfaces of the first luminescent portion and on an exposed surface of the first insulating layer corresponding to said region having no first luminescent film thereon;

forming a second luminescent film on a surface of said dielectric film provided on said upper surface of said first luminescent portion and on a surface of said dielectric film formed on said first insulating layer corresponding to said region having no first luminescent film thereon; and removing said dielectric film formed on said first luminescent portion and said second luminescent film formed thereon to form a second luminescent portion onto the dielectric film formed on the first insulating layer.

23. A method for fabricating an electroluminescent device according to claim 22, wherein said first luminescent portion uses zinc sulfide as a host material, and said dielectric film is formed under a gaseous atmosphere containing oxygen.

24. A method for fabricating an electroluminescent device according to claim 23, wherein said dielectric film is formed by sputtering.

25. A method for fabricating an electroluminescent device according to claim 22, wherein said dielectric film is made of a material based on a metal oxide which forms a hydroxyl group or a structure containing water.

26. A method for fabricating an electroluminescent device according to claim 25, wherein said dielectric film is made of at least one material selected from a group consisting of $Ta_2O_5$, $Cr_2O_3$, IrO, $Ir_2O_3$, and $Cu_2O$.

27. A method for fabricating an electroluminescent device according to claim 25, wherein a thickness of said dielectric film disposed under said second luminescent portion is between 50 nm and 200 nm.

28. A method for fabricating an electroluminescent device according to claim 25, wherein said dielectric film is made of at least one material selected from a group consisting of $Ta_2O_5$, $Cr_2o_3$, IrO, $Ir_2O_3$, and $CU_2O$, to which at least one material selected from a group consisting of $Al_2O_3$, $SiO_2$, $Y_2O_3$, $Wo_5$, and $Nb_20_5$ is added.

29. A method for fabricating an electroluminescent device according to claim 22, wherein said dielectric film disposed between said first and second luminescent portions isolates said first and second luminescent portions from each other, and said dielectric film selectively disposed under said second luminescent portion adjusts a luminescent threshold voltage of said second luminescent portion.

30. A method for fabricating an electroluminescent device according to claim 29, wherein a dielectric constant of said dielectric film for adjusting said luminescence threshold voltage of said second luminescent portion is lower than that of said second luminescent portion.

31. A method for fabricating an electroluminescent device according to claim 30, wherein a luminescent threshold voltage of said second luminescent portion is lower than that of said first luminescent portion, and said dielectric film having a dielectric constant lower than that of said second luminescent portion increases said luminescent threshold voltage of said second luminescent portion so that said luminescence threshold voltage of said second luminescent portion becomes substantially equal to said luminescence threshold voltage of said first luminescent portion.

32. A method for fabricating an electroluminescent device according to claim 31, wherein a luminance of said second luminescent portion per unit film thickness is higher than that of said first luminescent portion per unit film thickness, and said dielectric film lowers said luminance of said second luminescent portion so that said luminescent of said second luminescent portion becomes substantially equal to that of said first luminescent portion.

33. A method for fabricating an electroluminescent device according to claim 32, wherein said second luminescent portion is made of a manganese-doped zinc sulfide, and said first luminescent portion is made of a terbium-doped zinc sulfide.

34. A method for fabricating an electroluminescent device according to claim 31, wherein said second luminescent portion is made of a manganese-doped zinc sulfide, and said first luminescent portion in made of a terbium-doped zinc sulfide.

35. A method for fabricating an electroluminescent device according to claim 30, wherein a luminance of said second luminescent portion per unit film thickness is higher than that of said first luminescent portion per unit film thickness, and said dielectric film lowers said luminance of said second luminescent portion so that said luminance of said second luminescent portion becomes substantially equal to that of said first luminescent portion.

36. A method for fabricating an electroluminescent device according to claim 29, wherein said dielectric film for adjusting said luminescence threshold voltage of said second luminescent portion is formed on a side opposite to a light outgoing side of said second luminescent portion.

37. A method for fabricating an electroluminescent device according to claim 22, wherein said dielectric film is made of a material having a refractive index lower than that of both said first and second luminescent portions.

38. A method for fabricating an electroluminescent device according to claim 22, wherein a dielectric constant of said dielectric film for adjusting the luminescence threshold voltage of said second luminescent potion is higher than that of said first luminescent portion.

39. A method for fabricating an electroluminescent device according to claim 38, wherein a luminescence threshold voltage of said second luminescent portion is higher than that of said first luminescent portion, and said dielectric film having a dielectric constant higher than that of said second luminescent portion reduces said luminescent threshold voltage of said second luminescent portion so that said luminescence threshold voltage of said second luminescent portion becomes substantially equal to said luminescence threshold voltage of said first luminescent portion.

40. A method for fabricating an electroluminescent device according to claim 39, wherein a luminance of said second luminescent portion per unit film thickness is lower than that of said first luminescent portion per unit film thickness, and said dielectric film increases said luminance of said second luminescent portion so that said luminance of said second luminescent portion becomes substantially equal to that of said first luminescent portion.

41. A method for fabricating an electroluminescent device according to claim 39, wherein second luminescent portion is made of terbium-doped zinc sulfide, and said first luminescent portion is made of magnase-doped zinc sulfide.

42. A method for fabricating an electroluminescent device according to claim 41, further comprising a step of providing a red color filter selectively on a light outgoing side of said first luminescent portion.

43. A method for fabricating an electroluminescent device according to claim 38, wherein a luminance of said second luminescent portion per unit film thickness is lower than that of said first luminescent portion per unit film thickness, and said dielectric film increases said luminance of said second luminescent portion so that said luminance of said second luminescent portion becomes substantially equal to that of said first luminescent portion.

44. A method for fabricating an electroluminescent device according to claim 38, further comprising a step of providing a color filter for attenuating light of a predetermined wavelength selectively on a light outgoing side of said first luminescent portion.

45. A method for fabricating an electroluminescent device according to claim 22, wherein a total thickness of said second luminescent portion and said dielectric film is approximately the same as a thickness of said first luminescent portion.

46. A method for fabricating an electroluminescent device according to claim 22, wherein neighboring said first and second luminescent portions differing in luminescent color make up a pixel, a plurality of said pixels collectively form said luminescent layer.

* * * * *